United States Patent
Xiong et al.

(10) Patent No.: US 8,784,673 B2
(45) Date of Patent: Jul. 22, 2014

(54) HIGHLY ORGANIZED SINGLE-WALLED CARBON NANOTUBE NETWORKS AND METHOD OF MAKING USING TEMPLATE GUIDED FLUIDIC ASSEMBLY

(75) Inventors: Xugang Xiong, Boston, MA (US); Laila Jaberansari, Medford, MA (US); Ahmed Busnaina, Ashland, MA (US); Yung Joon Jung, Lexington, MA (US); Sivasubramanian Somu, Boston, MA (US); Moneesh Upmanyu, Wakefield, MA (US)

(73) Assignee: Northeastern University, Boston, MA (US)

( * ) Notice: Subject to any disclaimer, the term of this patent is extended or adjusted under 35 U.S.C. 154(b) by 625 days.

(21) Appl. No.: 12/619,187

(22) Filed: Nov. 16, 2009

(65) Prior Publication Data

US 2010/0183844 A1  Jul. 22, 2010

Related U.S. Application Data

(60) Provisional application No. 61/199,274, filed on Nov. 14, 2008.

(51) Int. Cl.
*B44C 1/22* (2006.01)

(52) U.S. Cl.
USPC .............. 216/17; 216/37; 216/41; 216/67; 977/742

(58) Field of Classification Search
USPC ........................ 216/17, 37, 67, 41
See application file for complete search history.

(56) References Cited

U.S. PATENT DOCUMENTS

| | | | | |
|---|---|---|---|---|
| 6,479,372 | B1* | 11/2002 | Liou et al. | 438/524 |
| 7,195,872 | B2* | 3/2007 | Agrawal et al. | 435/287.2 |
| 7,794,799 | B1* | 9/2010 | Kim et al. | 427/532 |
| 2002/0150683 | A1* | 10/2002 | Troian et al. | 427/256 |
| 2006/0251795 | A1* | 11/2006 | Kobrin et al. | 427/2.1 |
| 2009/0246408 | A1* | 10/2009 | Chan et al. | 427/577 |
| 2009/0294404 | A1* | 12/2009 | Colpo et al. | 216/67 |
| 2009/0304944 | A1* | 12/2009 | Sudarsan et al. | 427/458 |
| 2010/0117764 | A1* | 5/2010 | Wang et al. | 333/204 |

OTHER PUBLICATIONS

Jung et al., "High-Density, Large-Area Single-Walled Carbon Nanotube Networks on Nanoscale Patterned Substrates", J. Phys. Chem. B, vol. 107 (2003), pp. 6859-6864.
Hata et al., "Water-Assisted Highly Efficient Synthesis of Impurity-Free Single-Walled Carbon Nanotubes", Science, vol. 306 (2004), pp. 1362-1364.
Wei et al., "Organized assembly of carbon nanotubes", Nature, vol. 416 (2002), pp. 495-496.

(Continued)

*Primary Examiner* — Shamim Ahmed
(74) *Attorney, Agent, or Firm* — McLane, Graf, Raulerson & Middleton, PA

(57) ABSTRACT

Methods for fabricating templates for nanoelement assembly and methods for fluid-guided assembly of nanoelements are provided. Templates are fabricated by plasma modification of surface hydrophilicity and production of a network of hydrophobic trenches having a hydrophilic bottom surface. Single-walled carbon nanotubes (SWNT) can be assembled into stable films, ribbons, and wires of nanoscale thickness and nanoscale or microscale width and length. The nanofilm assemblies prepared according to the invention are highly conductive and can be used in the fabrication of a wide variety of microscale and nanoscale electronic devices.

15 Claims, 14 Drawing Sheets

(56) References Cited

OTHER PUBLICATIONS

Cassell et al., "Large Scale CVD Synthesis of Single-Walled Carbon Nanotubes", J. Phys. Chem. B, vol. 103 (1999), pp. 6484-6492.
Lee et al., "Linker-free directed assembly of high-performance integrated devices based on nanotubes and nanowires", Nature, vol. 1 (2006), pp. 66-71.
Kamat et al., "Self-Assembled Linear Bundles of Single Wall Carbon Nanotubes and Their Alignment and Deposition as a Film in a dc Field", J. Am. Chem. Soc., vol. 126 (2004), pp. 10757-10762.
Makaram et al., "Scalable nanotemplate assisted directed assembly of single walled carbon nanotubes for nanoscale devices", Applied Physics Letters, vol. 90 (2007), pp. 243108-1-243108-3,.
Makaram et al., "Three-dimensional assembly of single-walled carbon nanotube interconnects using dielectrophoresis", Nanotechnology, vol. 18 (2007), pp. 1-5.
LeMieux et al., "Self-Sorted, Aligned Nanotube Networks for Thin-Film Transistors", Science, vol. 321 (2008), pp. 101-104.
Xiong et al., "Building Highly Organized Single-Walled-Carbon-Nanotube Networks Using Template-Guided Fluidic Assembly", Small, vol. 3 (12) (2007), pp. 2006-2010.
Ko et al., "Combing and Bending of Carbon Nanotube Arrays with Confined Microfluidic Flow on Patterned Surfaces", J. Phys. Chem. B, vol. 108 (2004), pp. 4385-4393.
Juillerat et al., "Fabrication of large-area ordered arrays of nanoparticles on patterned substrates", Nanotechnology, vol. 16 (2005), pp. 1311-1316.
Yin et al., "Template-Assisted Self-Assembly: A Practical Route to Complex Aggregates of Monodispersed Colloids with Well-Defined Sizes, Shapes, and Structures", J. Am. Chem. Soc., vol. 123 (2001), pp. 8718-8729.
Xu et al., "Self-Assembly of Gradient Concentric Rings via Solvent Evaporation from a Capillary Bridge", Physical Review Letters, vol. 96 (6) (2006), pp. 066104-1-066104-4.
Govor et al., "Nanoparticle ring formation in evaporating micron-size droplets", Applied Physics Letters, vol. 84 (23) (2004), pp. 4774-4776.
Petit et al., "Combing of Molecules in Microchannels (COMMC): A method for Micropatterning and Orienting Stretched Molecules of DNA on a Surface", Nano Letters, vol. 3 (8), pp. 1141-1146, 2003.

\* cited by examiner

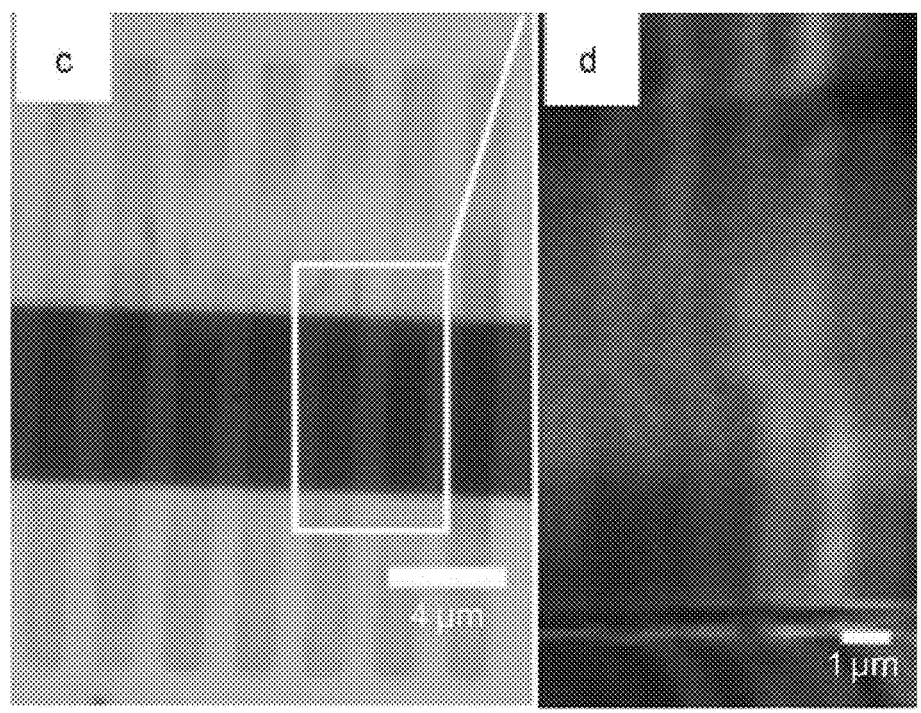
*FIG. 9C*  *FIG. 9D*

FIG. 13E
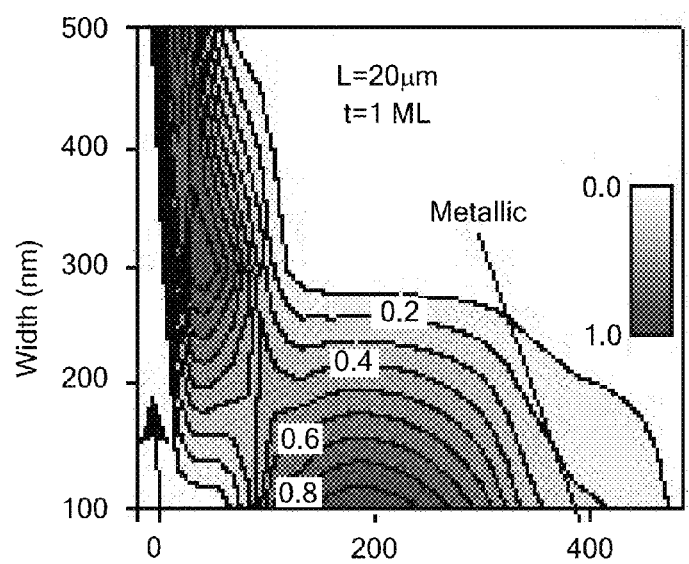
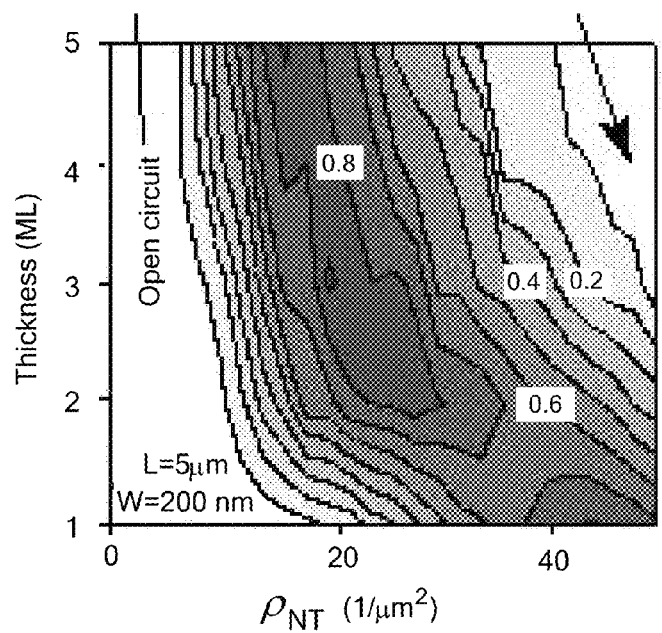
FIG. 13F

HIGHLY ORGANIZED SINGLE-WALLED CARBON NANOTUBE NETWORKS AND METHOD OF MAKING USING TEMPLATE GUIDED FLUIDIC ASSEMBLY

CROSS REFERENCE TO RELATED APPLICATIONS

The present utility patent application claims the benefit of priority to U.S. Provisional Patent Application No. 61/199,274 filed Nov. 14, 2008 entitled "BUILDING HIGHLY ORGANIZED SINGLE-WALLED CARBON NANOTUBE NETWORKS USING TEMPLATE GUIDED FLUIDIC ASSEMBLY", which is hereby incorporated by reference.

STATEMENT REGARDING FEDERALLY SPONSORED RESEARCH

The research leading to this invention was carried out with U.S. Government support provided under grants from the National Science Foundation (NSF-0425826 and NSF-0825864). The U.S. Government has certain rights in the invention.

BACKGROUND OF THE INVENTION

Carbon nanotubes (CNT) are promising candidates for the use as components in nanoscale electronics and electromechanical devices due to their superior mechanical properties, high electron mobility, large current capability, and unique one-dimensional nanostructure. In order to implement these applications, it is essential to develop a simple and reliable manufacturing process that controllably assembles CNT in desired locations with controlled orientations and nanoscale dimensions over a large area.

Previous attempts to assemble CNT into useful structures have utilized chemical vapor deposition (Y. Jung et al., J. Phys. Chem B (2003) 107:6859; K. Hata et al. Science (2004) 306:1362; B. Wei et al., Nature (2002) 416:495; A. Casell et al., J. Phys. Chem. B (1999) 103:6484), chemical functionalization (M. Lee et al., Nat. Nanotech. (2006) 1:66; P. Kamat et al., J. Am. Chem. Soc. (2004) 126:10757), electrophoretic deposition and dielectrophoresis (Lee et al., 2006; P. Makaram et al., Appl. Phys. Lett. (2007) 90:243108(1-3); P. Makaram et al., Nanotechnology (2007) 18:395204(1-5)). Chemical vapor deposition can be used to directly synthesize CNT at desired locations on a substrate by patterning catalyst materials; however, the high temperature of this process (500-900° C.) and difficulty in controlling the growth direction and the density of CNT significantly limits the effectiveness of this method, especially in electronic device applications. Electrophoretic and dielectrophoretic methods can be used to fabricate highly oriented CNT between electrodes, but they are effective only within local areas where the electric field is effective. There remains a need for methods of assembling CNT and other nanoelements over large areas, preferably under ambient conditions.

BRIEF SUMMARY OF THE INVENTION

The invention presents methods for fabricating templates for nanoelement assembly and methods for assembling nanoelements, such as single-walled carbon nanotubes (SWNT), into stable films, ribbons, and wires of nanoscale thickness and nanoscale or microscale width and length. The nanofilm assemblies prepared according to the invention are highly conducting and can be used in the fabrication of microscale and nanoscale electronic devices.

One aspect of the invention is a method for fabricating a nanofilm of nanoelement such as SWNT. The method includes the steps of providing a template for fabricating the nanofilm, submersing the template in a suspension of the SWNT, and pulling the submersed template up through the air-water interface of the suspension. The template includes a substrate having an upper hydrophobic surface and one or more nanoscale trenches. The trenches possess a bottom hydrophilic surface that attracts the SWNT suspension, leading to the assembly of a nanofilm of SWNT while the template is pulled through the air-water interface. In some embodiments, the SWNT from the suspension become aligned in the trenches during the assembly process to form a nanofilm having metallic conductance properties. The method can be used to prepare highly conductive nanoscale and microscale components of electrical circuits, including transistors, circuit interconnects, sensors, and batteries.

Another aspect of the invention is a method for fabricating a template for the assembly of nanoelements. The method includes the steps of etching a surface of a substrate with a plasma to render the surface hydrophilic, coating the etched surface with a hydrophobic mask material, and preparing one or more nanoscale trenches in the mask material by removing selected portions of the mask material using lithography. The lithography process exposes the etched substrate surface to form the bottom surface of the trenches. Templates produced by the method can be used in the above-described method of making nanofilms.

Yet another aspect of the invention is a nanofilm or nanowire containing a plurality of SWNT. The nanofilm has a thickness in the range from about 10 nm to about 500 nm. The width and length of the nanofilm can range from nanoscale dimensions, 50 nm for example, to microscale dimensions of 10 μm or more. In some embodiments, the nanofilm contains aligned SWNT, and in other embodiments the nanofilm has nonaligned SWNT. In different embodiments, the nanofilm can have ohmic conductance properties or it can be semiconducting, depending on the alignment and density of the nanotubes.

Other features and advantages of the invention will be apparent from the following description of the preferred embodiments thereof and from the claims, taken in conjunction with the accompanying drawings.

BRIEF DESCRIPTION OF THE DRAWINGS

FIG. 2(*a*-1) to (*a*-3) is a silicon substrate. FIG. 2(*b*-1) to (*b*-3) is a silicon oxide substrate. FIG. 2*c* is a PMMA-coated silicon substrate.

FIGS. 13a-f show the results of nanoscale confinement analysis for the assembly of SWNT in trenches of different width. FIG. 13a shows the network topologies observed in three different 2D simulations with varying widths. FIGS. 13b-d show plots of the probability of the nature of electrical percolation through the network as a function of network density. FIG. 13e shows a contour plot of the probability of semiconducting behavior across the 2D network as a function of width (vertical axis) and density (horizontal axis). FIG. 13f shows a plot similar to that of FIG. 13e, but for multilayer, quasi 2D simulations with varying channel thickness, $t = 1-5$ monolayers.

DETAILED DESCRIPTION OF THE INVENTION

Figure 1:
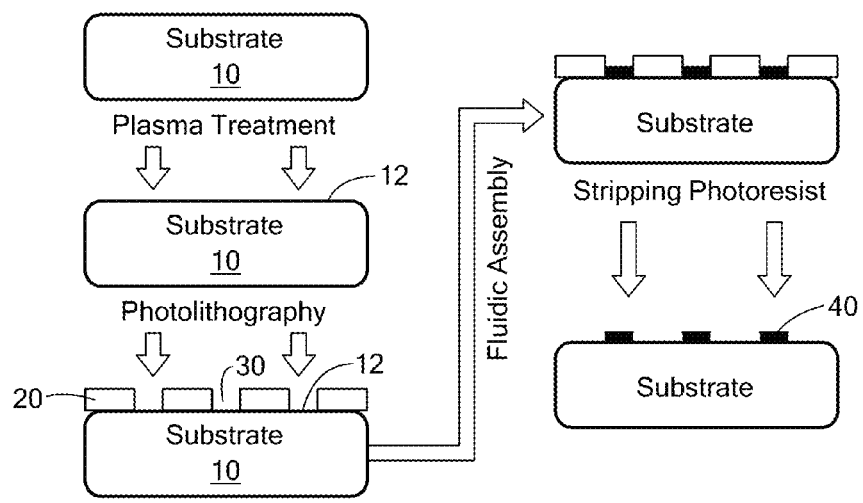
FIG. 1 shows a schematic representation of a process for preparing a template by plasma modification and lithographic patterning of a substrate and assembling a nanofilm from an aqueous suspension of SWNT.

The present invention makes possible the assembly of highly organized lateral networks of nanofilms containing single-walled carbon nanotubes (SWNT) over a large area. The controlled fabrication of organized SWNT nanofilm structures is achieved through plasma-enhanced surface modification and a microscale or nanoscale template-guided site-selective assembly process. The fabrication procedure is compatible with current complementary metal oxide semiconductor (CMOS) processes and can be scaled up for large scale fabrication. The SWNT nanofilms and nanofilm networks can be directly used for applications including high-performance interconnects, field effect transistors (FETs), nanoswitches, diverse sensing elements, microbatteries, and flexible electronic devices.

The nanofilm assembly process of the present invention requires preparing a network of trenches or channels having a hydrophilic bottom surface surrounded by a hydrophobic mask material on a substrate. The hydrophilic trench surfaces create a wettable pattern that attracts an aqueous suspension of SWNT and allows an SWNT film to deposit and attach to the surface. The SWNT film is deposited by simply lifting the substrate through the surface of an aqueous SWNT suspension, preferably with the direction of motion aligned with the long axis of the trench surfaces on which the nanofilm is to deposit. Once the film has been deposited, the hydrophobic mask material is removed, e.g., it can be dissolved away by washing in an appropriate solvent, leaving the patterned film on the substrate. The film is then stabilized, for example, by van der Waals interactions or other types of bonds between the deposited nanoelements and/or between the nanoelements and the substrate. The method is effective to create nanoscale and microscale SWNT networks resulting in large scale architectures. Assembly is accomplished using a simple dry plasma treatment to change the surface property of patterned substrates from hydrophobic to hydrophilic, and creates a pattern of nanoelements such as SWNT without the need to for complex wet chemical functionalization processes.

The term "nanoscale" as used herein refers to a size or dimension of an object or a portion of an object in the range from about 1 nm to about 1000 nm. The term "microscale" as used herein refers to a size or dimension of an object or a portion of an object in the range from about 1 μm to about 1000 μm.

A "nanofilm" as used herein means a film having a thickness in the nanoscale range and a surface area that is any size. A nanofilm according to the invention is deposited by a method of the invention, and the nanofilm can be used either as an end product, as deposited, or as a raw material that is gathered and stored or transported for later use, such as incorporation into a circuit or other device. While the nanoelement assemblies according to the invention are generally flat, and are thus termed nanofilms, they may also take a more compact form (e.g., when deposited in a narrow nanoscale trench) and can be termed "nanowires".

A "substrate" as used herein refers to a solid material upon which nanoelements are deposited to form a nanofilm by a method according to the invention. A substrate is generally flat but can have any dimensions, according to its anticipated use. The substrate can be of any suitable material, but usually the substrate contains a material such as silicon, silicon oxide, or a hydrophobic polymer such as parylene-C or polyethylene terephthalate (PET). Preferably, the substrate has a hydrophobic surface that can be rendered hydrophilic by a plasma etching technique. The substrate can be homogeneous throughout, or it can have a layered structure. If layered, the uppermost substrate layer is preferably hydrophobic.

The term "hydrophobic polymer" as used herein refers to any organic polymer resistant to wetting by water or a polar solvent, or lacking affinity for water or a polar solvent. Examples of hydrophobic polymers include, by way of illustration only, polyolefins, such as polyethylene, poly (isobutene), poly(isoprene), poly(4-methyl-1-pentene), polypropylene, ethylene-propylene copolymers, ethylene-propylene-hexadiene copolymers, and ethylene-vinyl acetate copolymers; metallocene polyolefins, such as ethylene-butene copolymers and ethylene-octene copolymers; styrene polymers, such as poly(styrene), poly(2-methylstyrene), and styrene-acrylonitrile copolymers having less than about 20 mole-percent acrylonitrile; vinyl polymers, such as poly(vinyl butyrate), poly(vinyl decanoate), poly(vinyl dodecanoate), poly(vinyl hexadecanoate), poly(vinyl hexanoate), poly(vinyl octanoate), and poly(methacrylonitrile); acrylic polymers, such as poly(n-butyl acetate), and poly(ethyl acrylate); methacrylic polymers, such as poly(benzyl methacrylate), poly(n-butyl methacrylate), poly(isobutyl methacrylate), poly(t-butyl methacrylate), poly(t-butylaminoethyl methacrylate), poly(do-decyl methacrylate), poly(ethyl methacrylate), poly(2-ethylhexyl methacrylate), poly(n-hexyl methacrylate), poly(phenyl methacrylate), poly(n-propyl methacrylate), and poly(octadecyl methacrylate); polyesters, such a poly(ethylene terephthalate) and poly(butylene terephthalate); and polyalkenes and polyalkynes, such as polybutylene and polyacetylene.

A "trench" or "channel" as used herein means a recessed region in a mask on a substrate, intended as a receptacle for the deposition of nanoelements. A trench can have any shape, as required for the application. In some embodiments, the trench is essentially rectangular in cross-section, with a short axis and a long axis. A trench is formed in a layer of mask material on a substrate by a lithography process, such as light or electron beam lithography. The pattern established by lithography leaves a trench having side walls composed of the mask material, which is hydrophobic, and a bottom surface of exposed substrate material, which is hydrophilic. The "aspect ratio" of a trench refers to the ratio of the depth of the trench (which is equal to the height of the trench sidewalls) to the width of the trench (i.e. the width of the exposed substrate at the bottom surface of the trench. A "nanoscale trench" refers to a trench that is nanoscale in its width. A "microscale trench" refers to a trench that is microscale in its width. However, even in a nanoscale or microscale trench, the length is limited only by the particular application, and can range in length from 10 nm to several cm or more. There are in principle no limits to either the width or length of a trench according to the invention, other than the practicalities of carrying out the dipping process and the size of the available substrate material.

A "hydrophilic" surface as used herein is a surface that is polar, or has exposed polar charged or uncharged chemical groups attached, such that the surface is readily wettable by polar solvents such as water, alcohols, or other polar solvents or mixtures of polar solvents. A hydrophilic surface is also characterized by a contact angle of less than about 35 degrees. For certain embodiments, a hydrophilic surface according to the invention has a contact angle less than about 30 degrees, less than about 20 degrees, less than about 10 degrees, less than about 5 degrees, or less than about 2 degrees, or essentially zero degrees.

A "hydrophobic" surface as used herein is a surface that is nonpolar, or has exposed nonpolar or lipophilic groups attached, such that the surface is not readily wettable by polar solvents. A hydrophobic surface is also characterized by a contact angle of at least about 35 degrees. For certain embodiments, a hydrophobic surface has a contact angle of at least about 40 degrees, at least about 45 degrees, or at least about 50 degrees.

The "contact angle" of a surface refers to the angle formed by a droplet of a liquid such as water deposited on the surface and surrounded by a gas such as air above the surface. The contact angle is the angle formed by the liquid at the three phase boundary where the liquid, gas, and solid surface intersect. The contact angle of a surface depends on the hydrophilicity or hydrophobicity of the surface. A larger contact angle indicates a more hydrophobic surface, and a smaller contact angle indicates a more hydrophilic surface.

A "nanoelement" as used herein is any nanoscale physical structure that can be assembled to form a nanofilm using a method according to the invention. Examples of such nanoelements include nanotubes, nanoparticles, and nanowires. Preferred nanoelements are carbon nanotubes (CNT), which include single-walled carbon nanotubes (SWNT) or multi-walled carbon nanotubes. SWNT have a diameter on the order of nanometers and can be several microns in length. SWNT can behave as metals (metallic SWNT) or semiconductors (semiconducting SWNT) depending on their chirality and physical geometry. Most preferred for use in the invention are SWNT of mixed chirality, i.e., a mixture of both metallic and semiconducting SWNT. SWNT can be derivatized or functionalized. Preferred are open-ended SWNT that terminate in carboxyl groups, which bear a net negative charge that can be offset by binding to cations.

Nanoelements such as SWNT are applied to a plasma-etched substrate by means of dipping the substrate into a suspension of nanoelements in a polar solvent, such as water, an alcohol, or a water/alcohol mixture, and slowly raising the substrate across the air-water interface at the surface of the suspension. The concentration of SWNT affects the formation and thickness of the resulting nanofilm. A commercially available SWNT suspension having a concentration of 0.23 wt % SWNT in deionized water is suitable. Generally, the SWNT or nanoelement concentration in the suspension should be in the range from about 0.05 to about 1.0 wt %, and is preferably in the range from about 0.1 to about 0.5 wt %, more preferably in the range from about 0.15 to about 0.30 wt %. Higher or lower concentrations can result in thicker or thinner SWNT nanofilms, respectively. The substrate is extracted from the SWNT suspension at a slow continuous speed, so as to permit the deposition of SWNT onto the hydrophilic substrate surface. A speed of 0.1 mm per minute is suitable. In general, a pulling speed from about 0.01 to about 1.0 mm per minute can be used. Preferably the pulling speed is about 0.05 to about 0.2 mm per minute. The optimal pulling speed will depend on the nanoelement concentration, and the higher the concentration, the faster the pulling speed can be. If the pulling speed is too high, the nanofilm may have discontinuities. A device which can be used for pulling is a KSV Dip Coater (KSV Instruments, Helsinki, Finland).

An "air-water interface" as used herein refers to the surface, or air-liquid junction, of a liquid suspension containing a polar solvent and a plurality of suspended nanoelements such as SWNT. The air water interface of a nanoelement suspension is generally planar if at rest. To "submerse" or "dip" a substrate means to dip either the entire substrate or a portion of the substrate into a suspension of nanoelements in a polar solvent, the suspension being held in a suitable container. Submersion of a substrate can be performed manually or using a mechanism.

In the methods according to the invention, a substrate is rendered hydrophilic by brief chemical and/or etching with a plasma. The precise composition of the plasma and etching conditions will depend on the substrate material used. An example of a suitable plasma for substrate surfaces of silicon or silicon oxide is a plasma containing $SF_6$ and/or $O_2$. Another example is a plasma containing or consisting essentially of $SF_6$, $O_2$, and Ar. $SF_6$ could be substituted with $CF_4$, $CHF_3$, or $CCl_4$ in the plasma composition for etching. Preferably, the plasma includes a halogen-containing compound to provide electron-donating groups, and an inert gas to provide a physical etching effect. Yet another example is a plasma containing $O_2$, and Ar, which can render the surface of hydrophobic polymer substrates hydrophilic. An example of a condition that is effective with silicon substrates is to use an inductively coupled plasma comprising $SF_6$ delivered at 20 sccm, $O_2$ delivered at 20 sccm, and Ar delivered at 5 sccm. The concentrations and flow rates of these gases can be varied up to about 20% (increase or decrease) without adversely affecting the outcome. The duration of the plasma etching process should be brief, preferably on the order of a few seconds, or from about 2 s to about 100 s, more preferably about 5 s. The etching process can be optimized for any given substrate by measuring the contact angle, and choosing conditions that result in a contact angle of, for example, less than about 5 degrees for the etched substrate surface. Factors that can be optimized include the substrate chemical composition, substrate surface structure, plasma composition, etching time, and post-etching chemical treatment (e.g., washing with water to hydrolyze surface functional groups). Further enhancement of surface hydrophilicity can be obtained by exposing the plasma-treated surface to water.

As used herein, the term "consisting essentially of" means that, for some recited component or characteristic of a composition, the majority of the composition is represented by the specified component or characteristic, but that other components or characteristics also may be present in small amounts that do not materially affect the basic properties of the composition.

A "template" for nanoelement assembly as used herein refers to a substrate possessing a patterned layer of hydrophobic mask material on a surface of the substrate. The patterns are formed in the mask material by a lithography process, such as photolithography, which creates nanoscale trenches having a hydrophilic bottom surface. A "hydrophobic mask material" is any material suitable for a typical lithography process. The hydrophobic mask material can be a hydrophobic polymer such as PMMA. It is sufficiently hydrophobic as to repel a suspension of nanoelements in water or another polar solvent. The thickness of the hydrophobic mask material is in the range from about 100 nm to about 300 nm, and is preferably about 150 nm. Preferably, the hydrophobic mask material is soluble in a nonpolar organic solvent, so that the mask can be fully removed by solvent washing after nanoelement assembly.

FIG. 1 depicts a method of preparing a nanofilm using fluid-guided assembly onto a surface-modified template. Substrate 10 is subjected to treatment (etching) with a plasma, whereby surface 12 of the substrate is chemically modified to render it hydrophilic and wettable by a suspension of nanoelements, such as SWNT, in a polar solvent. A layer of hydrophobic mask material 20 is deposited on the modified substrate surface, and a pattern of trenches 30 is created in the mask by photolithography. The bottom surface of the trenches is the exposed modified surface 12 of the substrate. The template is then submerged in a suspension of SWNT, and the template is then slowly pulled upward through the air-water interface of the suspension (see FIG. 8b). During the pulling process, a layer of SWNT assembles in the trenches, giving rise to SWNT nanofilm 40. The mask material is dissolved away by solvent, leaving the substrate carrying patterned nanofilm 40 on surface 12.

One embodiment of the present invention is a method for fabricating a template used to assemble nanoelements such as SWNT by fluid-guided assembly. Aqueous suspensions of SWNT and other nanoelements are difficult to apply to silicon and other materials that are used in CMOS and other processes to manufacture nanoscale and microscale electronic devices. The inventors have developed a method of physically and chemically modifying a hydrophobic surface to make it more hydrophilic. The method involves etching a surface of a substrate with a plasma to render the surface hydrophilic. Brief exposure of a silicon, silicon dioxide, or hydrophobic polymer to an appropriate plasma results in the introduction of reactive ionic species and/or oxygen species, forming a basis to make the surface hydrophilic and wettable by SWNT suspensions. After a brief plasma treatment, the surface is coated with a lithography mask material which is hydrophobic. Performing lithography then simultaneously lays down a pattern, such as a circuit or component pattern or network, and exposes trenches having exposed modified (i.e., hydrophilic) substrate surface at the bottom of the trenches. This structure form a template for the fluid-guided assembly of nanoelements such as SWNT, which will readily assemble in the trenches but not on the upper or sidewall surfaces of the trenches.

Another embodiment of the present invention is a method for fabricating a nanofilm, nanoribbon, nanowire, or an entire network of such nanostructures in a single fluid-guided assembly step. The above-described template is provided as the starting point for the method. The template, or a portion of the template, then can be submersed into a suspension of the desired SWNT, CNT, or other nanoelements, and subsequently pulled out of the suspension at a slow, steady rate. As the template is pulled out of the suspension, the air-water interface at the top of the suspension is gently swept over the template, whereupon the assembly of the nanoelements onto the template is driven by the distribution of hydrophilic and hydrophobic surfaces on the template. The upper hydrophobic surface and the sidewalls of the hydrophobic mask material rejects the nanoelements, but the hydrophilic bottom surface of the trenches attracts the suspension and allows the nanoelements to align and adhere to the substrate, stabilized by van der Waals interactions and/or ionic and other interactions with one another and with the substrate. The assembled nanoelements form a stable nanofilm, having nanoscale thickness and nanoscale or even microscale width and length, following the network pattern laid down by lithography. Optionally, the mask material can be removed, for example by dissolving the material in a suitable solvent, leaving just the nanofilm stably deposited on the substrate and forming a desired network or circuit pattern.

A nanofilm or nanowire according to the invention, e.g., one containing a plurality of SWNT assembled as described above, forms a stable structure that can be removed from the substrate once formed. Thus, a nanofilm having a nanoscale thickness, such as from about 10 nm to about 500 nm, preferably about 50 nm to about 500 nm, or more, or about 50 nm to about 200 nm, can be prepared having any desired two-dimensional shape or pattern that can be used to create a suitable trench pattern, for example, by lithography. The width and length of the nanofilm thus can range from nanoscale dimensions, 50 nm for example, to microscale dimensions of 10 µm, 20 µm, 100 µm or more. Long nanoribbons of SWNT or other nanoelements can be prepared by the present method, removed from the template, and spooled or otherwise stored for later use in nanofabrication.

Nanofilms according to the invention are especially useful for their electrical properties, provided, for example, by SWNT. The films can be either metallic or semiconducting. Whether a film is metallic or semiconducting depends on the network of conducting paths through the film, especially on the network of metallic SWNT. The metallic or semiconducting nature of a nanofilm also depends on the alignment (i.e., aligned with the trench long axis vs. randomly oriented with respect to the trench axis) and relative density of the SWNT in the nanofilm. Both SWNT alignment (provided by confinement during assembly) and SWNT density (provided by the SWNT concentration used in the dipping suspension) can be adjusted either up or down by choosing appropriate conditions to make the film. Metallic films are more likely to be produced when using confinement to produce SWNT alignment and when using a high SWNT concentration to achieve high density in the film. Semiconducting nanofilms are more likely to be produced when using nonaligned films, or even in aligned films at low SWNT density, such that insufficient metallic SWNT are connected to form a continuous path of metallic SWNT along the length of the film.

Alignment of elongated nanoelements such as SWNT during template-guided fluidic assembly depends on the width of the trenches they are deposited in compared to the average length of the nanoelements. If the average length of the SWNTs is larger than the width of the trench, then the SWNTs will be aligned along the length of the trench during the assembly process. If the length of the SWNTs is smaller than the trench width, the SWNTs will be randomly oriented after assembly. If a nanofilm is assembled from a heterogeneous mixture of semiconducting and metallic SWNT, then good alignment of the SWNT, achieved by using a trench width smaller than the average length of the SWNT, yields a nanofilm in which semiconducting properties are predominant over metallic properties. This is due to the reduction in the number of active continuous metallic paths available for conduction. If a nanofilm of assembled mixed SWNT is used in as a channel in a field effect transistor, one can control the properties of the transistor by controlling the alignment of the SWNT (i.e., by adjusting the trench width with respect to the average SWNT length) in addition to adjusting the number of the layers of assembled SWNT. Using a higher concentration of SWNT in the dipping suspension results in the formation of a film with more layers (i.e., a multilayer). A lower concentration of SWNT can be used to form only a monolayer, or fewer layers, of SWNT in the film.

EXAMPLES

Example 1

Surface Modification of Substrates by Plasma Treatment

Figure 2:
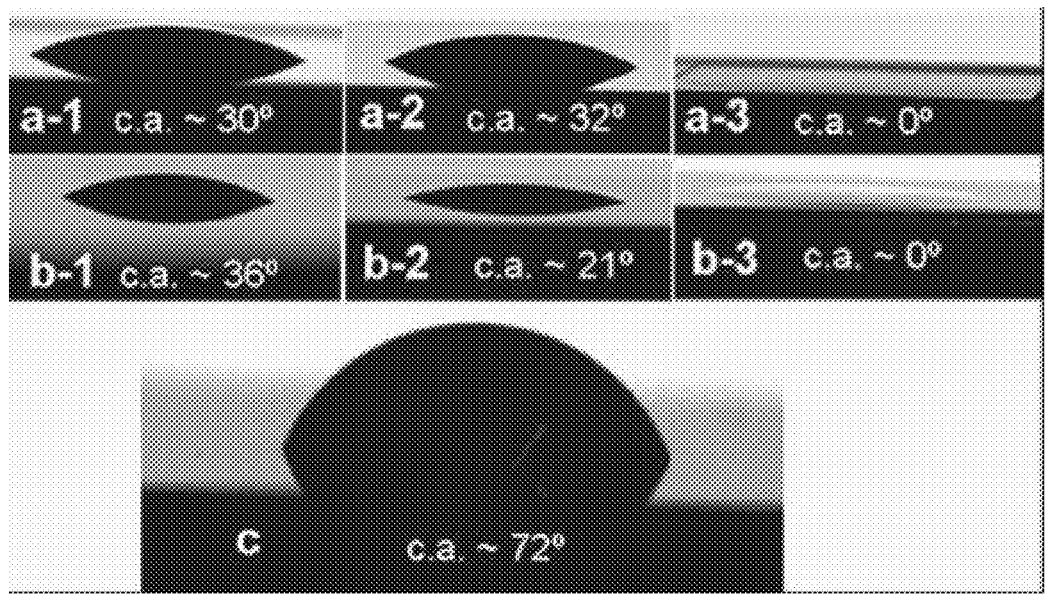
FIG. 2 shows droplets of aqueous SWNT suspension on various modified substrates used to measure the contact angle as a measure of hydrophilicity.

The effect of plasma treatment on the wetting behavior of SWNT suspension on various types of substrate was studied by measuring the contact angles between them. The results are shown in FIG. 2 for a silicon substrate (FIG. 2, *a*-1 through *a*-3), a silicon oxide substrate (FIG. 2, *b*-1 through *b*-3), and a polymethyl methacrylate (PMMA) substrate (FIG. 2*c*). The contact angles of a droplet of SWNT suspension on untreated silicon or silicon oxide substrates ranged between 30° and 40°, and was 72° on a surface of PMMA (see FIGS. 2 (*a*-1), (*b*-1) and c). After treatment of the silicon and silicon oxide substrates with plasma (an inductively coupled plasma was used, comprising $SF_6$ delivered at 20 sccm, $O_2$ delivered at 20 sccm, and Ar delivered at 5 sccm), the contact angle was rediced, but the change varied with the substrate. The contact angle on the oxide surface showed less change (FIG. 2 (*a*-2)), while that on the silicon surface was reduced by around 42% (FIG. 2 (*b*-2)). After flushing the silicon-based substrates in deionized water, the contact angles on both substrates decreased to less than 5°. See FIGS. 2 (*a*-3) and (*b*-3).

Sulfur oxyfluorides are known to be produced during plasma discharge due to the reaction of oxygen atoms with $SF_x$ radicals. (R. D'Agostino et al., J. Appl. Phys. (1981) 52:162; Y. Tzeng et al., J. Electrochem. Soc. (1987) 134:2304; M. Reiche et al., Cryst. Res. Technol. (2000) 35:807) In the presence of water, fluorosiloxanes hydrolyze to silicic acid ($SiO_2.nH_2O$). Monomeric silicic acid ($Si(OH)_4$) is a neutral, highly hydrophilic substance with Si—OH bonds. XPS analysis by Grundner et al. also indicates the existence of a large number of singular and associated OH groups under these conditions, which cause the surface to be hydrophilic. (M. Grundner et al., Appl. Phys. A (1986)39:73). In addition, $O_2$ plasma treatment also involves creation of damaged oxides with unsatisfied or chemically active surface SiOx bonds that contribute to surface hydrophilicity. (M. Wiegand et al., J. Electrochem. Soc. (2000) 147:2734).

Example 2

Effect of Duration of Plasma Treatment

Figure 3A:
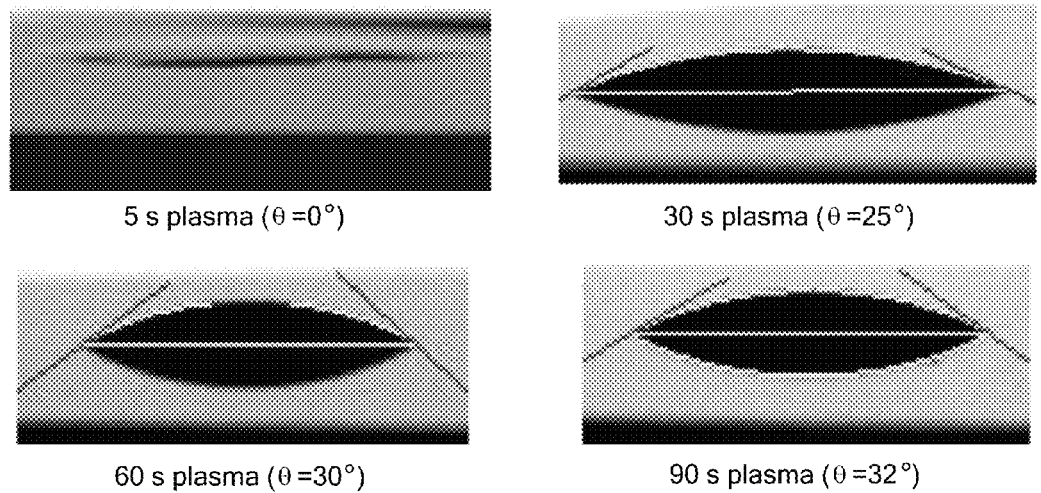
FIG. 3*a* shows experiments to measure the contact angle of a silicon oxide substrate after indicated times of plasma treatment.
Figure 3B:
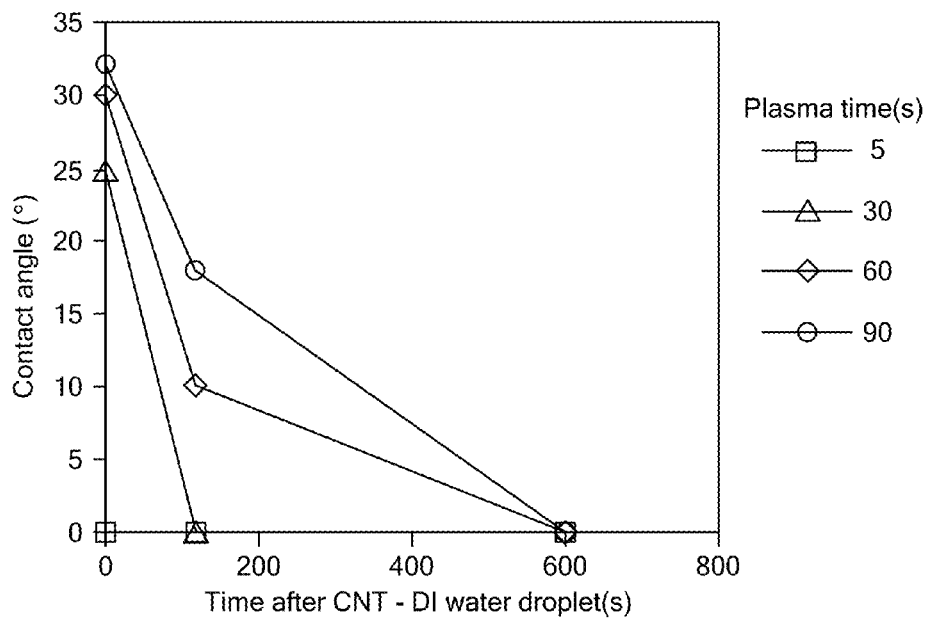
FIG. 3*b* shows the contact angle results.

FIG. 3*a* shows the results of the contact angle ($\Theta$) measurement right after dropping an SWNT-deionized water suspension onto silicon substrates that had been treated by exposure to the plasma of Example 1 for different times (5, 30, 60, and 90 s). The lowest contact angle (i.e., the most hydrophilic surface behavior) of SWNT solution was obtained with 5 s plasma etched silicon substrate ($\Theta=0°$), and the contact angle increased as the plasma etching time increased. However, given enough time, the contact angle gradually changed to 0°. FIG. 3*b* shows the change of contact angle with the plasma etch time after depositing a droplet of the SWNT suspension on silicon substrates. The results indicate that after only 5 s of plasma etching, the substrate has changed quickly to a completely hydrophilic surface, while if etching continues for longer the substrate is less hydrophilic, but eventually more hydrophilic groups are produced and the substrate again becomes very hydrophilic.

Figure 4:
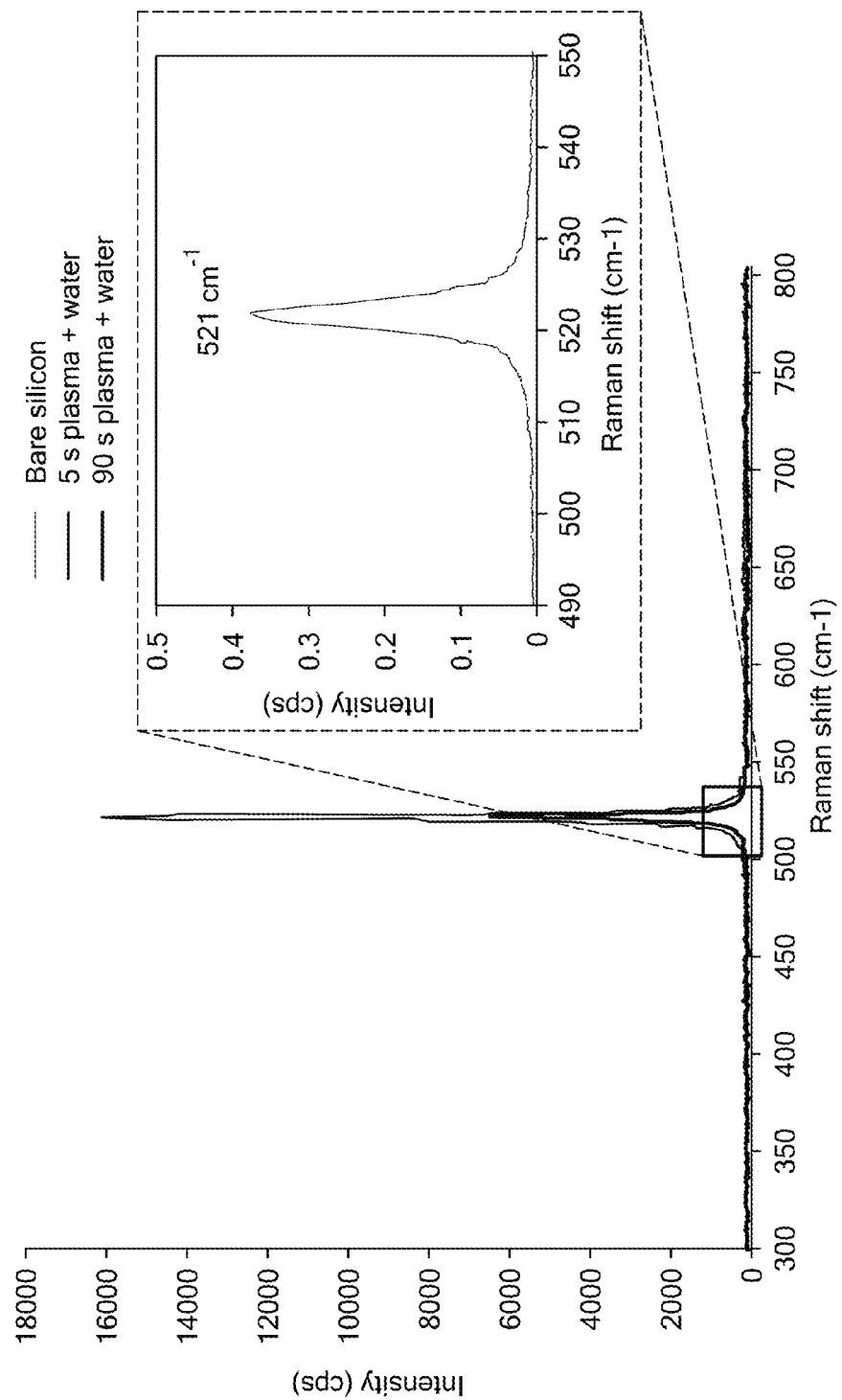
FIG. 4 shows the results of Raman spectroscopy of plasma-modified substrates.
Figure 5:
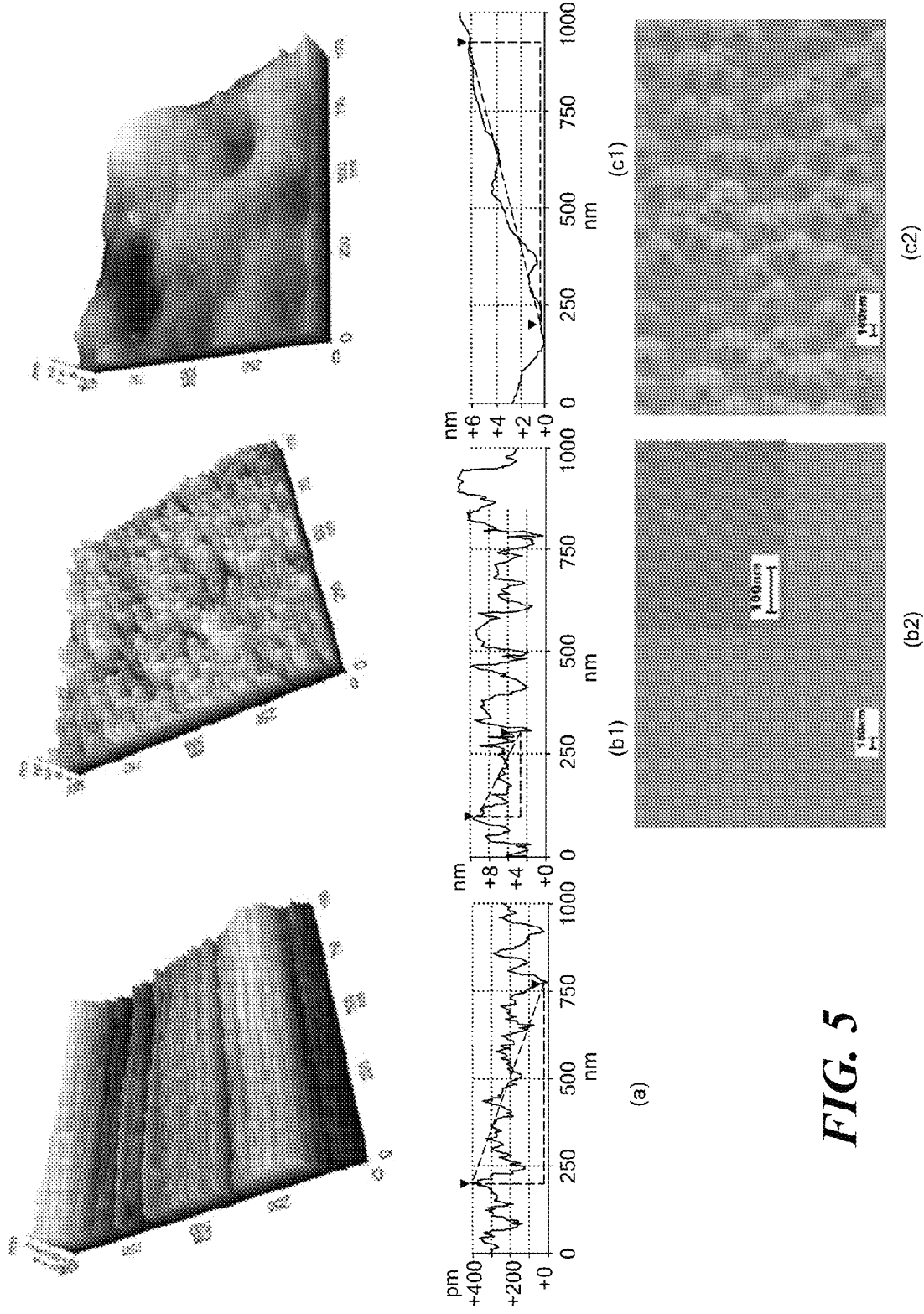
FIG. 5 shows analysis of surface modified silicon substrates by atomic force microscopy (AFM) (FIGS. 5 *a*1, *b*1, *c*1) and by scanning electron microscopy (FIGS. 5 *b*2, *c*2).

The effects of plasma etching for 5 s vs. 90 s on the silicon surface structure was studied using scanning electron microscopy (SEM), atomic force microscopy (AFM), and Raman spectroscopy. The Raman results are shown in FIG. 4, and the SEM and AFM results are shown in FIG. 5. The Raman spectra of FIG. 4 showed a dramatic increase in roughness after 5 s of plasma etching treatment followed by a diminishing of the surface roughness with further etching of the substrate. By AFM, the 5 s plasma-etched sample (FIG. 5(*b*1)) showed nanostructures on the silicon surface that were 50 nm wide and 5 nm high, but the 90 s plasma etched sample (FIG. 5(*c*1)) showed surface structures of around 400 nm wide with a height variation of about 5 nm over that area, whereas in bare silicon the surface protuberances were only 100-200 Å deep. These surface structures could be seen as the grain shaped domains in the SEM images (FIGS. 5(*b*2) and (*c*2)).

Figure 6:
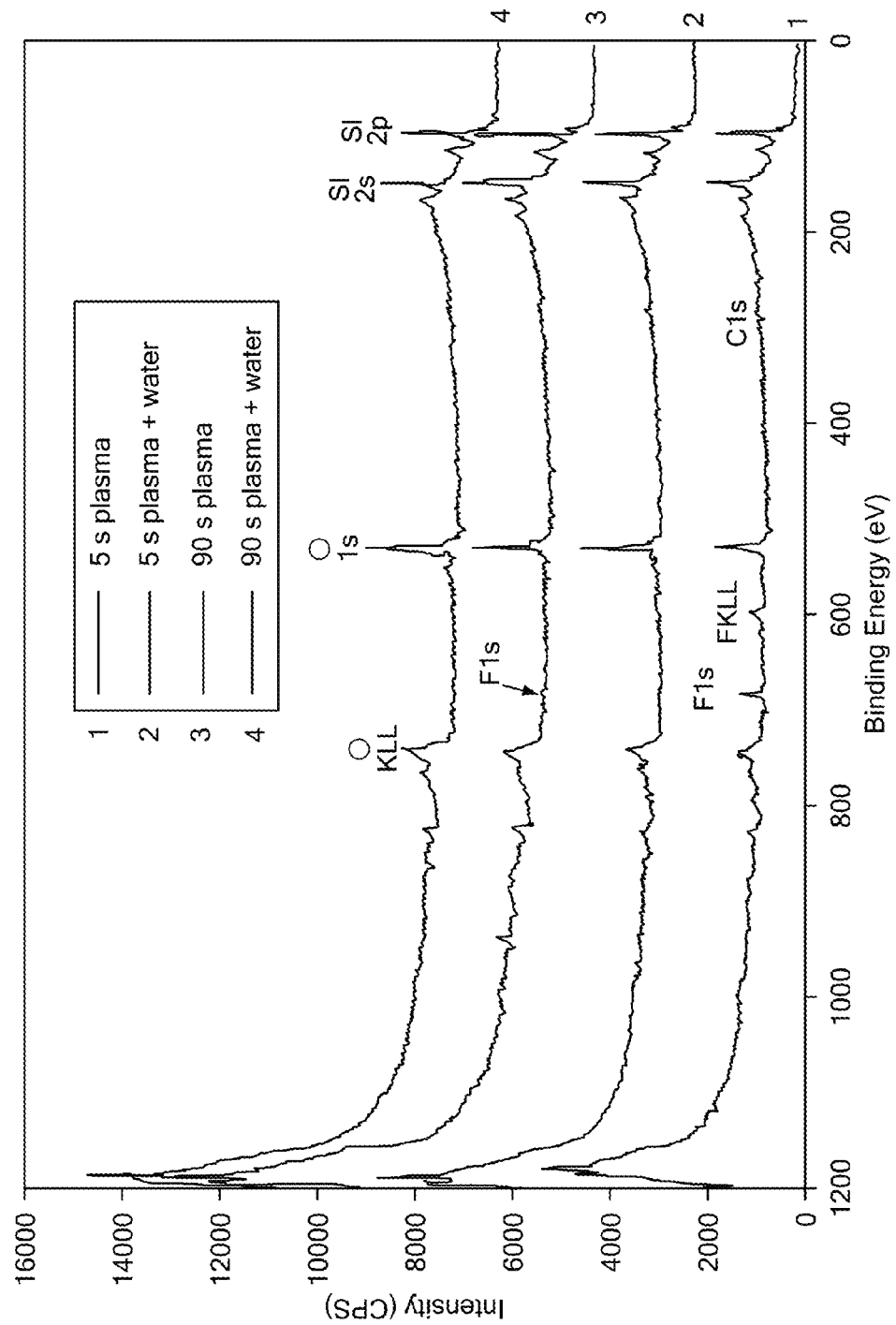
FIG. 6 shows the results of X-ray photoelectric spectroscopy (XPS) of plasma-modified substrates.

Although both the Raman and AFM results indicate an increase in the physical activity of the plasma-treated substrates, manifested as enhanced roughness, the nature of the chemical functional groups that are produced as the result of plasma treatment remained unclear. To acquire a better understanding of the latter, XPS was performed X-ray photoelectron spectroscopy (XPS) on the plasma-etched silicon surface. The XPS experiments were performed on a KRATOS analytical spectrometer using Mg K$\alpha$ (1253.6 eV). Narrow scan spectra of all regions of interest were recorded with 160 eV pass energy in order to identify the elemental bonding states. FIG. 6 shows a large XPS spectrum acquired with low resolution of plasma etched and water treated silicon substrate. The XPS analysis shows that the surface layer of samples after exposure to $SF_6/Ar/O_2$ plasma consisted mainly of silicon, oxygen and fluorine, with a small amount of carbon. Analysis of silicon XPS required correction of the spectral energy scale due to specimen charging. The binding energy was aligned such that the C 1s line from adventitious carbon contamination is at 284.8 eV. The amount of fluorine at the surface after plasma treatment was much larger for the 5 s plasma treated sample (about 7% of surface atoms) compared with 90 s plasma treated silicon (less than 1% of surface atoms). The fact that fluorine peaks vanish after rinsing in water for both samples shows that the Si—F bonds that formed were easily replaced by Si—OH groups in the presence of water.

Example 3

Fluidic Assembly of SWNT Nanofilms on Silicon Oxide and Gold Substrates

Figure 7:
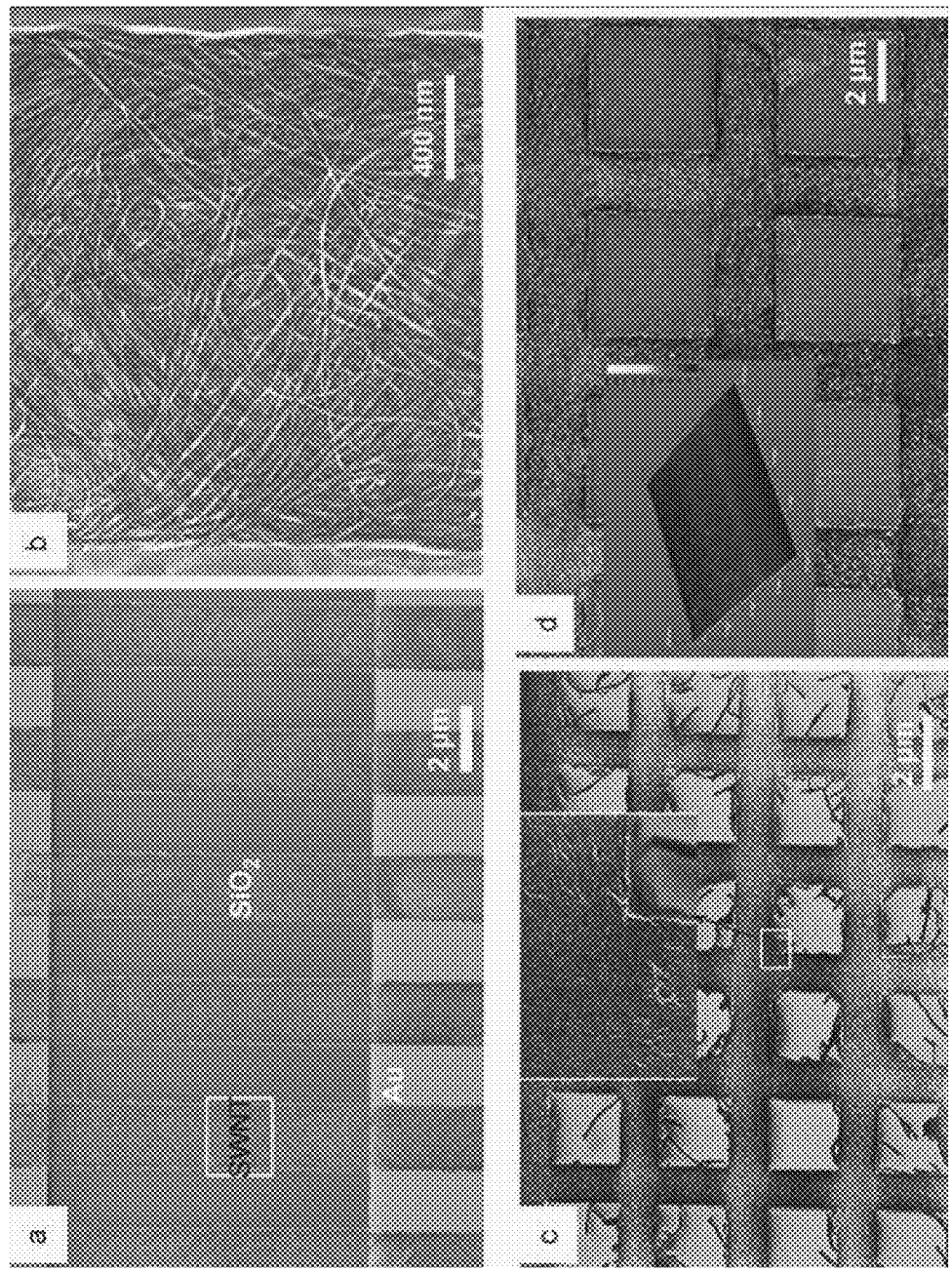
FIG. 7a-d shows SEM of SWNT nanofilms and nanofilm networks assembled on SiO₂/Au plasma-modified substrates.

An aqueous SWNT suspension was used to assemble SWNTs onto lithographically predefined locations of a substrate containing both silicon oxide and gold surfaces, as shown in FIG. 7*a*. The substrate was plasma etched as described in Example 1, following which a 150 nm thick layer of PMMA was deposited onto the etched surface. The substrate was then patterned by photolithography into areas having different wetting (hydrophilic/hydrophobic) properties. The patterned substrate was then dipped into and lifted out from a suspension containing 0.23 wt % SWNT in deionized water, following which the PMMA layer was dissolved in acetone, and the substrate containing assembled SWNT was washed in deionized water and dried. The SWNT preferentially attached to pre-defined channels with hydrophilic properties (exposed plasma-treated substrate), while the hydrophobic areas (PMMA) had little or no affinity for the suspension or SWNTs. During the drying process, the SWNT population migrated in the opposite direction compared to the sweep direction of liquid-air contact line across the substrate. FIG. 7b shows that the assembly was achieved continuously on both gold and silicon oxide substrate surfaces. More complex SWNT networks also were fabricated, as illustrated in FIGS. 7c and 7d.

Figure 8:
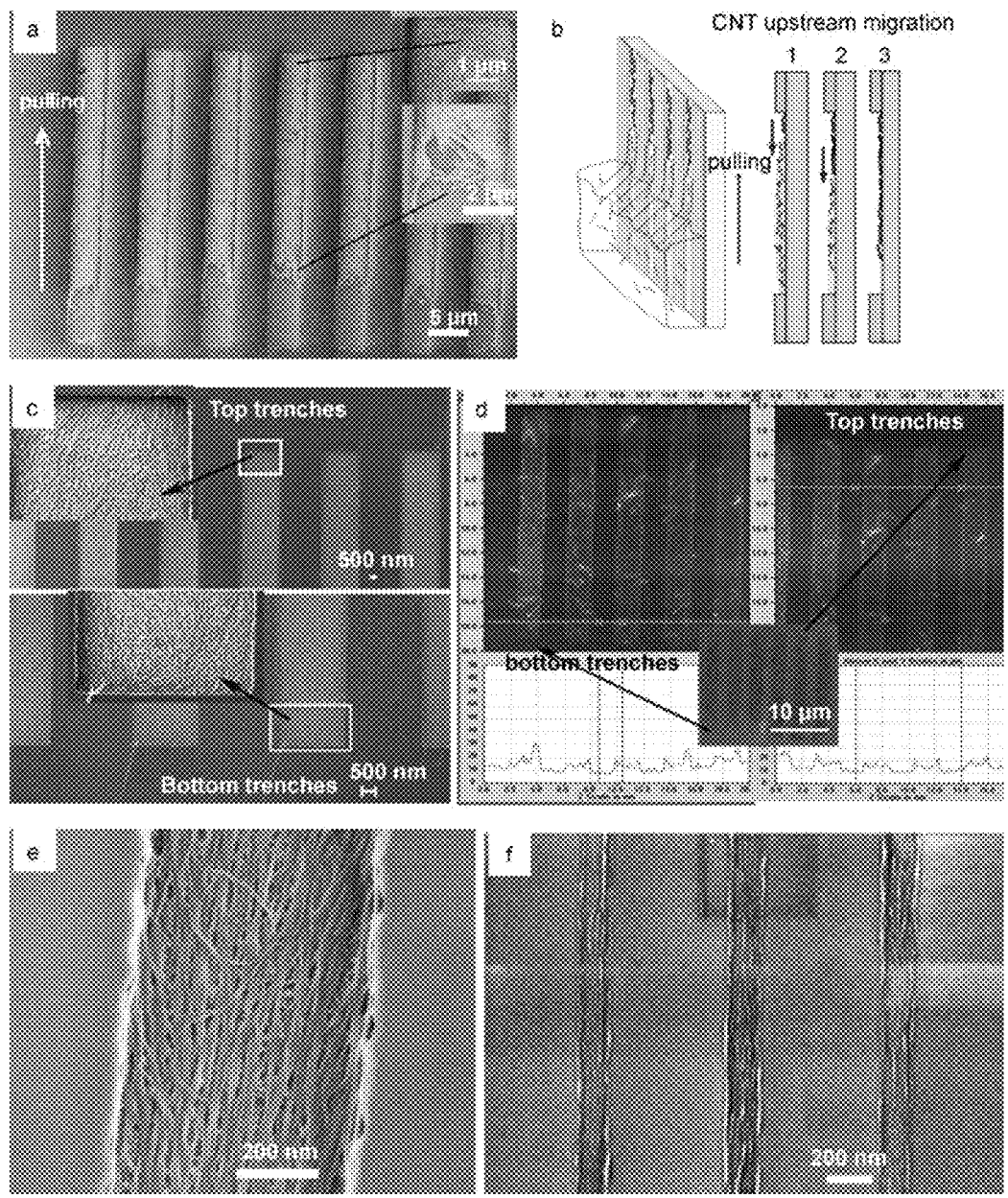
FIG. 8a-f shows SEM of extended SWNT nanofilms (a-d) and aligned nanofilms or nanowires (e-f).

Closer examination of assembled SWNT nanofilms is shown in FIG. 8. Using template fabrication by photolithography, SWNT arrays could be fabricated on an extended scale, as shown in FIG. 8a-d. When the width of template channels was shrunk to nanoscale, well-aligned SWNT nanofilms or nanowires were achieved (FIG. 8e-f).

Example 4

Analysis of SWNT Nanofilms

Figure 9A:
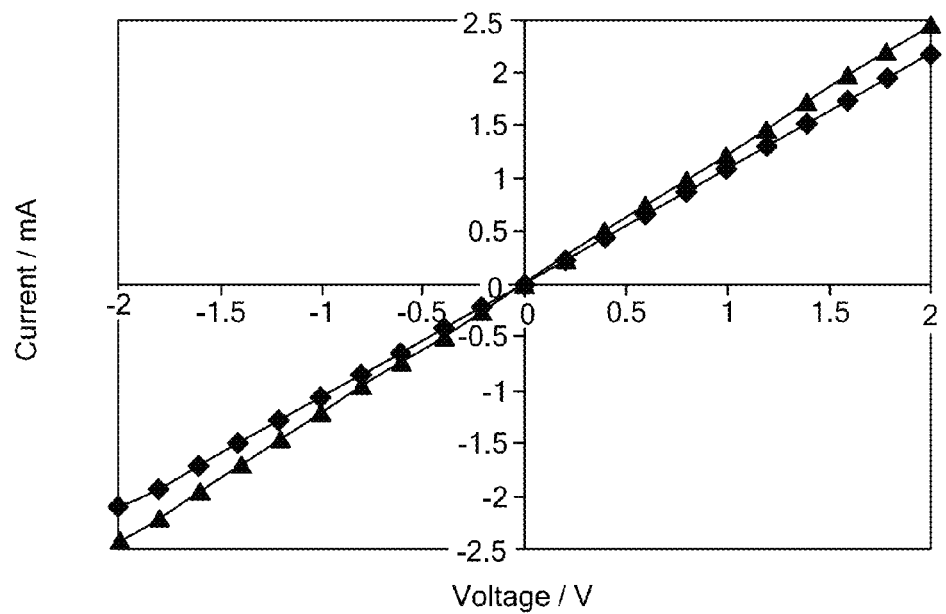
FIG. 9 shows the electrical conductance properties (a), Raman spectroscopy (b), and SEM of SWNT nanofilms.
Figure 9B:
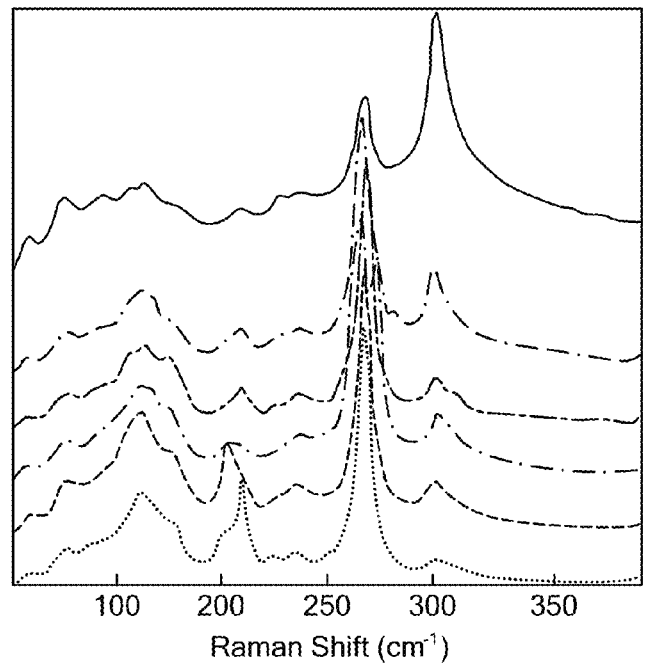

Preliminary electrical characterization of SWNT nanofilms was conducted using pre-fabricated gold electrodes. I-V measurements from two different locations on an SWNT nanofilms are shown in FIG. 9a, and the results exhibit metallic conductance characteristics (linear I-V curve) for aligned SWNT assembled networks. To understand the observed characteristics further, Raman spectroscopy was used to obtain structural information on the assembled SWNTs. FIG. 9b shows the typical low-frequency Raman spectra at the radial breathing mode (RBM) regions obtained from 6 different designated spots on the assembled SWNT films. The RBM signals from the assembled SWNTs are observed in the frequency range of 160-275 $cm^{-1}$. The diameter of the assembled SWNT was calculated from equation $d(nm)=A/[\omega(/cm)]$, where d is the assembled SWNT diameter, A is a proportionality constant (248), and $\omega$ is the RBM frequency. The observed frequencies of the RBM peaks corresponded to SWNT diameters in the range of 0.9-1.55 nm. FIG. 9d illustrates the Raman mapped image from the SWNT patterns on the silicon oxide surface. The image shows three different colors representing different types of materials/structures. Red is the frequency range of 290-310 $cm^{-1}$ (silicon); blue shows the frequency range of 260-280 $cm^{-1}$ (SWNT); and green represents the frequency range of 160-180 $cm^{-1}$ (SWNT). It is known from a previous study that metallic SWNTs have RBM frequencies around 260 $cm^{-1}$, and semiconducting SWNTs have RBM modes around 180 $cm^{-1}$. (R. Krupke et al., Science (2003) 301:344; R. Krupke et al., Nano Lett. (2004) 4 :1395). The presently observed RBM peaks indicate the presence of both types of SWNTs in the nanowire.

Figure 10:
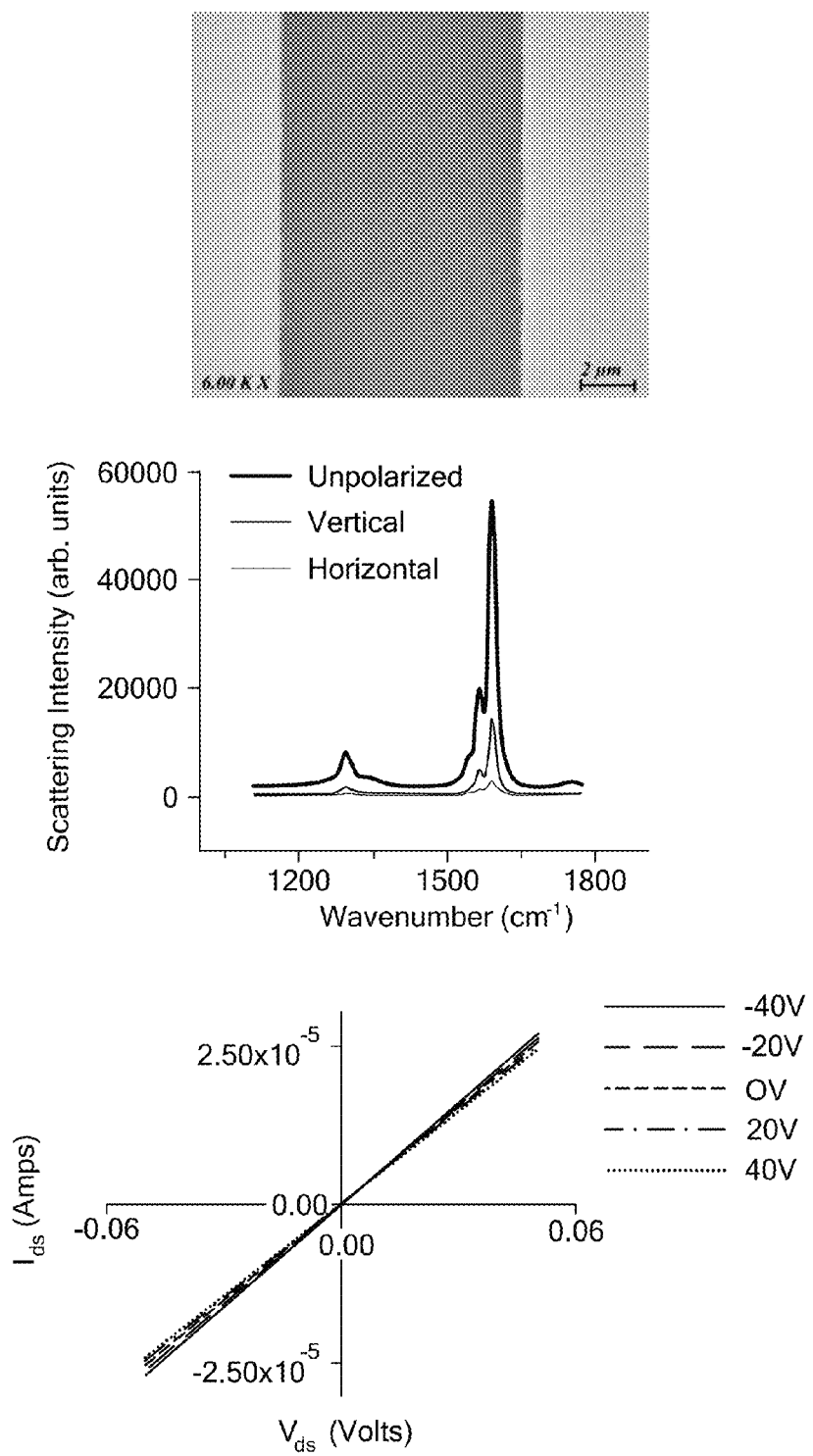
FIG. 10 shows the SEM, Raman spectroscopy, and electrical conductance properties of a broad SWNT nanofilm.
Figure 11:
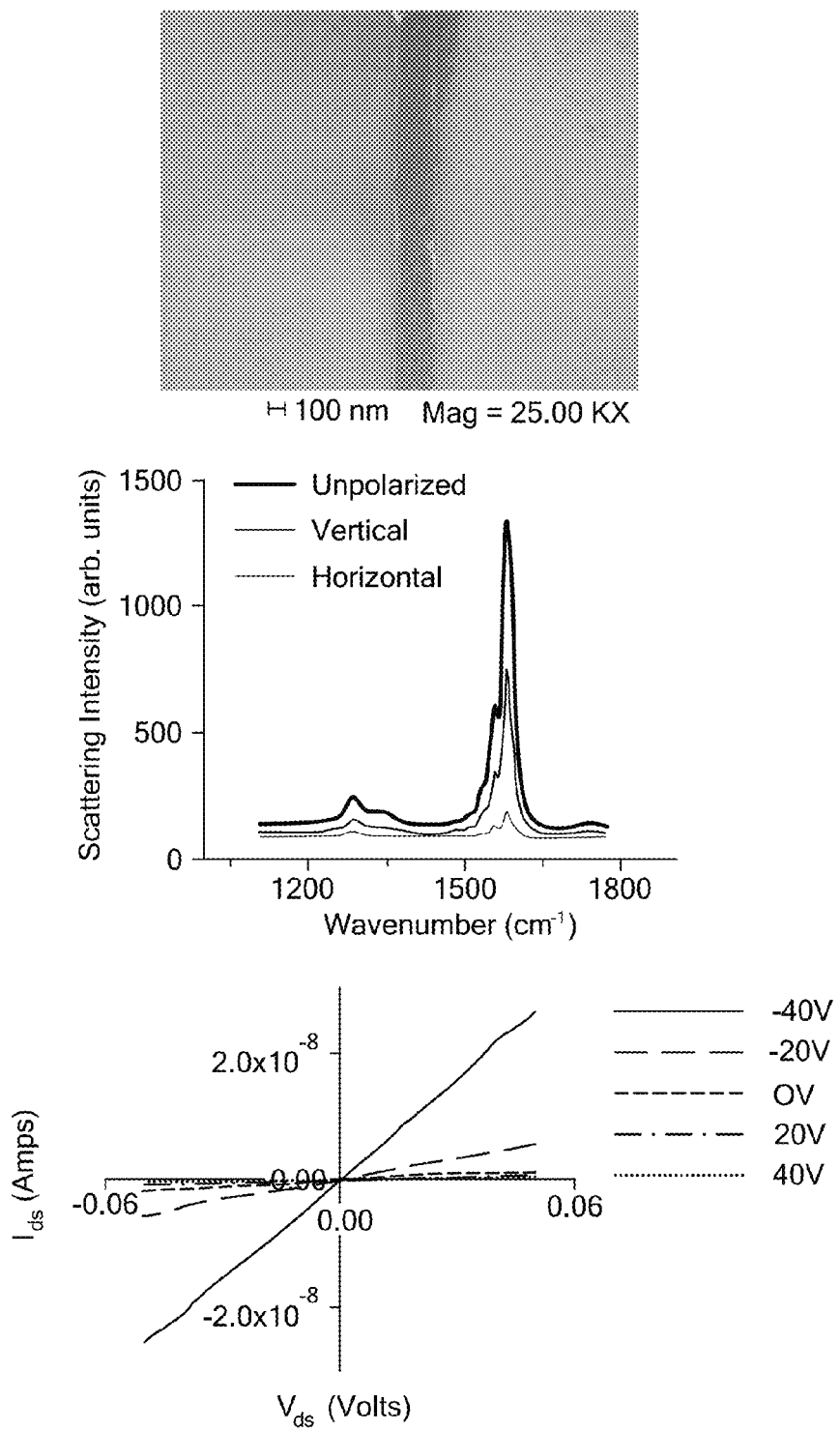
FIG. 11 shows the SEM, Raman spectroscopy, and electrical conductance properties of a confined SWNT nanofilm.

FIG. 10 shows a high resolution SEM micrograph, electrical output characteristics, and polarized Raman spectroscopy of SWNTs assembled in a 9 micron wide channel, whose length was ~20 μm. It is clear from the SEM micrograph that the assembled SWNT were randomly oriented, and the ON/OFF ratio was 1.178. The polarized Raman spectroscopic data also show that the assembly yielded a random orientation. FIG. 11 shows a high resolution SEM micrograph, electrical output characteristics, and Raman spectroscopy of SWNTs assembled in a 200 nm wide channel having a length of ~20 μm. The assembly was very well aligned along the length of the channel, and ON/OFF ratio was on the order of $10^3$. The polarized Raman spectroscopic data also show that the assembly was very well aligned along the length of the channel. When the channel is multilayered the typical ON/OFF ratio was 3.

Figure 12:
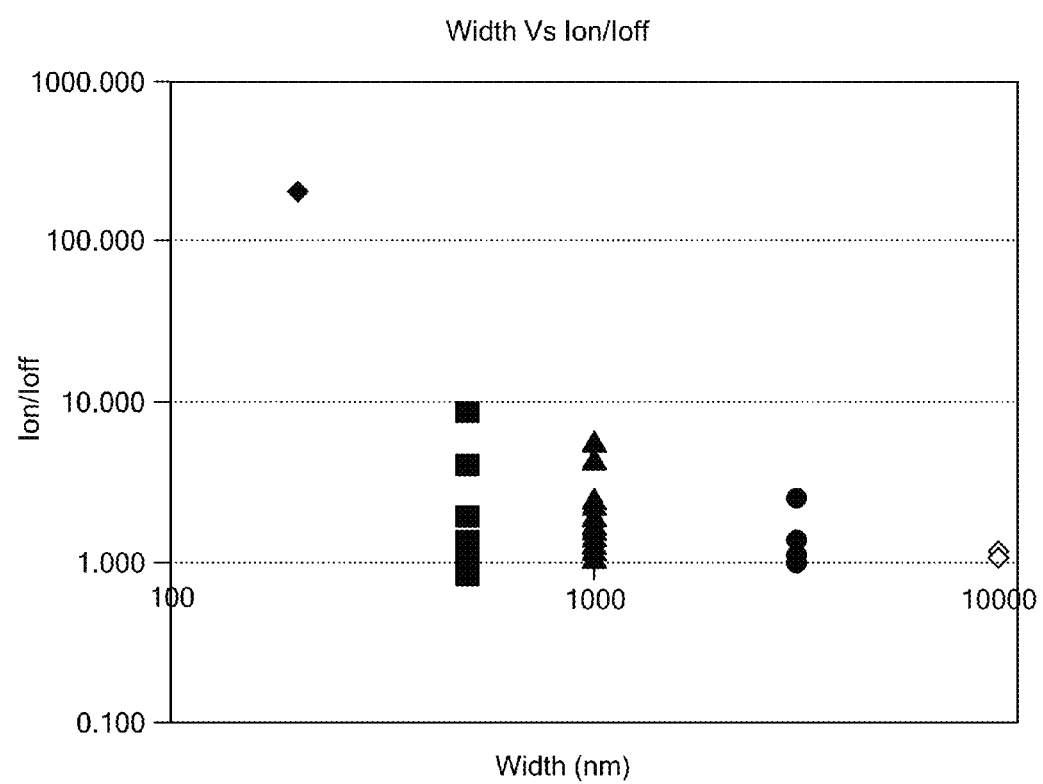
FIG. 12 shows Ion/Ioff values for SWNT nanofilms as a function of film width.

A plot of the ON/OFF ratios for various SWNT nanofilm thicknesses is shown in FIG. 12. Samples for which the ON/OFF ratios were high correspond to monolayer assembly, while the samples with lower ON/OFF ratios correspond to channels with assembly of multilayers of SWNT. Where the whole channel consisted of SWNT monolayer, the ON/OFF ratio was on the order of $10^5$.

Example 5

Modeling of Nanoscale Confinement in SWNT Assembly

Figure 13A:
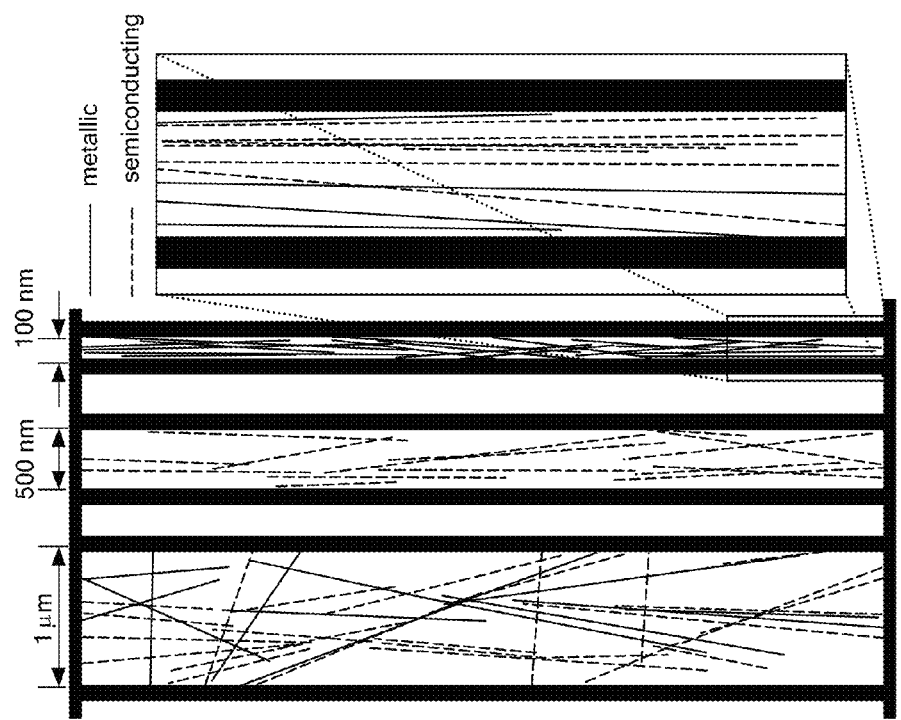
Figure 13B:
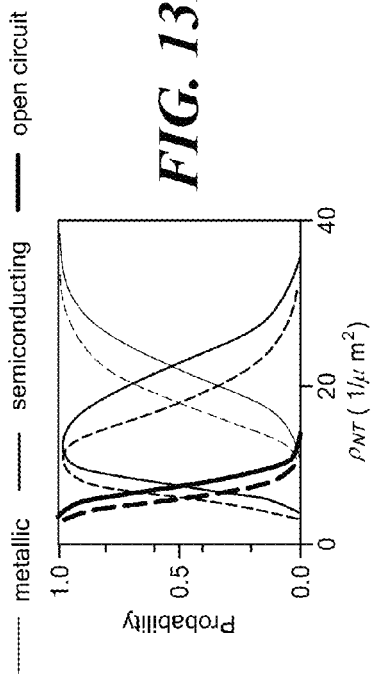
Figure 13C:
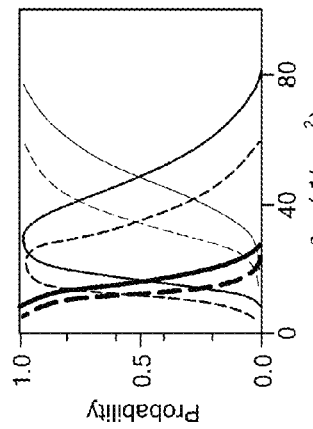
Figure 13D:
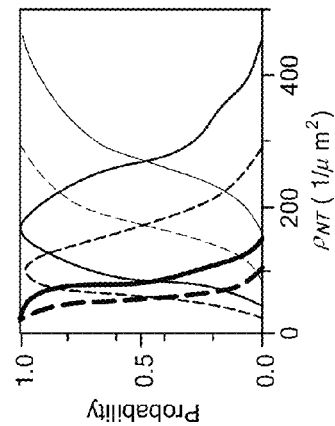

Systematic model computations of nanotube assembly on experiment-scale channels for a more comprehensive understanding of the effect of nanoscale confinement were carried out. In order to gain sufficient statistics on the interplay between topology and the nature of electrical percolation within the network, the effect of channel width "W" was explored using 2D computations while multi-layer, quasi-2D computations were used to study the effect of channel thickness. SWNTs were randomly placed onto channels with prescribed dimensions until the desired network density $P_{NT}$ was obtained. The stochastic procedure was aimed at capturing the topologies that result during fluidic assembly. The average length of the SWNTs was matched to that in the experimental samples, about 2μ. For efficiency, a locally relaxed configuration of the as-generated network was obtained by coarse-graining the randomly placed SWCNTs as rods and allowing them to interact. FIG. 13a shows specific instances of the electrically heterogeneous network topologies obtained in three simulations with varying widths, W=1 μm, 500 nm and 100 nm. In each case, the SWNT network was confined when the channel width was smaller than the average SWNT length, W<1. Clear evidence is seen of a topology that becomes increasingly aligned with decreasing width. The alignment in the computations was initiated by the as-generated random topologies and then further reinforced by the local relaxations induced by SWNT interactions. Finally, the network topologies were analyzed for the nature of the electronic percolation. For a given network density, the ratio of semiconducting to metallic SWNTs was fixed to the theoretical density (3:1), and each SWNT was then randomly assigned a metallic or semiconducting character. The overall percolation can result in i) open circuit (OC), ii) semiconducting, or iii) metallic conductance across the network. Multiple simulations were performed for each channel geometry and SWNT density to get a statistical understanding of the form of percolation. FIG. 13b-d shows the percolation probability through the network as a function of the network density for the three channel widths shown in FIG. 13a. Irrespective of the trench geometry, the trends were qualitatively similar. At very low densities, there are not enough nanotubes to conduct across the network and the probability of an open circuit is high. As the density is increased, probability of a connected circuit increases. Since the semiconducting SWNTs dominate the heterogeneous mix, the network is mainly semiconducting and the small number of metallic SWCNTs are electrically shielded. As the density is further increased, the metal nanotubes are able to percolate as well, and a transition from semiconducting to metallic conductance is observed.

While the present invention has been described in conjunction with certain preferred embodiments, one of ordinary skill, after reading the foregoing specification, will be able to effect various changes, substitutions of equivalents, and other alterations to the compositions and methods set forth herein. It is therefore intended that the protection granted by Letters Patent hereon be limited only by the definitions contained in the appended claims and equivalents thereof.

What is claimed is:

1. A method for fabricating a nanofilm, comprising the steps of:
   providing a template for fabricating a nanofilm, the template comprising a substrate comprising an upper hydrophobic surface and one or more nanoscale trenches, the trenches comprising hydrophobic sidewalls below the upper hydrophobic surface and a bottom plasma-etched, to provide roughened hydrophilic surface;
   submersing the template or a portion thereof in a suspension of single-walled carbon nanotubes (SWNT) in a polar solvent; and
   pulling the submersed template or portion thereof up through an air-water interface of the suspension, whereby SWNT from the suspension become aligned in the trenches to form a nanofilm within the trenches.

2. The method of claim 1, wherein the bottom hydrophilic surface possesses a hydrophilicity corresponding to a contact angle of less than 5 degrees.

3. The method of claim 1, wherein the hydrophobic surface possesses a hydrophobicity corresponding to a contact angle of greater than 45 degrees.

4. The method of claim 1, wherein the hydrophobic surface is formed by a layer of hydrophobic mask material deposited on the substrate.

5. The method of claim 4, wherein portions of the hydrophobic mask material are removed to form the one or more nanoscale trenches, exposing the underlying substrate as the bottom hydrophilic surface of the trenches.

6. The method of claim 5 further comprising, after the formation of one or more nanofilms, the step of removing the hydrophobic mask material from the substrate.

7. The method of claim 4, wherein the hydrophobic material is polymethyl methacrylate.

8. The method of claim 1, wherein the suspension comprises a mixture of semiconducting and metallic SWNT.

9. The method of claim 1, wherein the nanoscale trenches have a width of at least 50 nm.

10. The method of claim 9, wherein the nanoscale trenches have a width in the range of 50 nm to 1000 nm.

11. The method of claim 1, wherein the nanoscale trenches have a depth in the range of 50 nm to 500 nm.

12. The method of claim 1, wherein the nanoscale trenches have an aspect ratio of about 50 nm depth to about 150 nm width.

13. The method of claim 1, wherein the formed nanofilms have an essentially linear current-voltage relation.

14. The method of claim 1, wherein the formed nanofilms have a non-linear current-voltage relation.

15. The method of claim 1, wherein the substrate comprises a material selected from the group consisting of silicon, silicon oxide, gold, and a hydrophobic polymer.

* * * * *